United States Patent
Nielsen et al.

[11] Patent Number: 6,118,335
[45] Date of Patent: Sep. 12, 2000

[54] METHOD AND APPARATUS FOR PROVIDING ADAPTIVE PREDISTORTION IN POWER AMPLIFIER AND BASE STATION UTILIZING SAME

[75] Inventors: Jorgen S. Nielsen; David M. Tholl; Trevor A. Page, all of Calgary, Canada

[73] Assignee: Nortel Networks Corporation, Montreal

[21] Appl. No.: 09/306,607

[22] Filed: May 6, 1999

[51] Int. Cl.[7] .............................. G01R 19/00; H03G 3/20; H03F 1/26

[52] U.S. Cl. .................................. 330/2; 330/129; 330/149

[58] Field of Search .................... 330/2, 129, 149

[56] References Cited

U.S. PATENT DOCUMENTS

| | | | |
|---|---|---|---|
| 4,291,277 | 9/1981 | Davis et al. | 330/149 |
| 5,148,448 | 9/1992 | Karam et al. | 375/60 |
| 5,870,668 | 2/1999 | Takano et al. | 455/126 |
| 5,892,397 | 4/1999 | Belcher et al. | 330/149 |
| 5,929,703 | 7/1999 | Sehier et al. | 330/149 |
| 5,990,738 | 11/1999 | Wright et al. | 330/149 |

Primary Examiner—Robert Pascal
Assistant Examiner—Patricia T. Nguyen
Attorney, Agent, or Firm—Schwegman, Lundberg, Woessner & Kluth, P.A.

[57] ABSTRACT

A high power amplifier (103, FIG. 7) comprises a basic power module (15, FIG. 7), a parameter generator (50, FIG. 7), an amplifier gain model (60, FIG. 7), and a predistortion module (40, FIG. 7). The high power amplifier amplifies a linear radio frequency signal with a minimum of distortion, even near its maximum power output, by using an adaptive predistortion algorithm comprising an amplifier gain model 60 based upon a polynomial function of the power module 15 gain function and a time constant. The input signal into the amplifier 103 is continually compared with the amplifier 103 output using a Kalman filter, and model parameters are generated to model 60, which generates distortion compensating values that are combined with the input signal in predistortion module 40 to produce a predistorted input signal into power module 15, which generates the amplifier output. Also described are a method (70, FIG. 8) of operating the power amplifier and a base station (101, FIG. 9) utilizing the power amplifier for wireless communication.

17 Claims, 5 Drawing Sheets

METHOD AND APPARATUS FOR PROVIDING ADAPTIVE PREDISTORTION IN POWER AMPLIFIER AND BASE STATION UTILIZING SAME

TECHNICAL FIELD

The invention relates to a method and apparatus for providing adaptive predistortion in a power amplifier and, in particular, to a high power amplifier for amplifying a linear radio frequency signal with a minimum of distortion. The invention also relates to a base station which utilizes the power amplifier for radio communication.

BACKGROUND OF THE INVENTION

In the field of radio communication systems it is a well known problem that the power amplifier of broadcast transmission equipment, such as the wireless base station 1 having antenna 2 illustrated in FIG. 1, operates in a non-linear fashion when the power amplifier is operated near its peak output. As a result the power amplifier introduces significant signal distortion, which can appear in various forms.

If more than one signal is input into the power amplifier or power amplification stage, its non-linear characteristics can cause an undesirable multiplicative interaction of the signals being amplified, and the amplifier's output can contain intermodulation products. These intermodulation products cause interference and crosstalk over the amplifier's operational frequency range, which interference and crosstalk can exceed regulatory broadcast transmission standards.

In addition to signal distortion taking the form of a degradation of the spectral components of the signal being amplified, it can also take the form of spurious spectral output outside of the bandwidth of the signal being amplified.

By reducing the amplifier output, one can make the amplifier operate substantially in its linear region. However, this also tends to diminish substantially the power conversion efficiency of the amplifier, so that a larger, more expensive amplifier would have to be used to support transmitter output power at a given level.

FIG. 2 illustrates a simplified block diagram of a typical base station transmitter operating with quadrature amplitude modulation (QAM). An in-phase component (I) and a quadrature component (Q) of baseband signal 6 are combined with a local oscillator 10 signal in modulator 8 and the resulting up-converted radio frequency (RF) signal is applied to the high power amplifier (HPA) 12. HPA 12 amplifies the up-converted RF signal for transmission by antenna 2.

A broadcast system employing QAM requires the transmitter to vary both the phase and amplitude of the transmitted signal. A power amplifier that performs non-linearly as it approaches its peak output generally has significant difficulty in implementing the QAM scheme, so that as a result spurious emissions are often transmitted out of an assigned RF channel, contrary to required industry standards and governmental regulations.

Besides the clearly sub-optimal solution of reducing the HPA output power level to achieve linear power output, it is known in the art to use various linearization schemes.

For example, FIG. 3 illustrates a block diagram of a high power amplifier (HPA) employing a feed forward linearization technique. The input to basic power module (BPM) 15 and the output of BPM 15 are both fed into a comparison circuit 16, which generates a difference output to error amplifier 20. The output of error amplifier 20 is applied to summing circuit 18, to which is also applied the BPM output. The BPM output is thus modified in response to differences in the content of the signal going into the BPM and that of the signal coming out of the BPM.

FIG. 4 illustrates a block diagram of a high power amplifier (HPA) employing a feedback linearization technique. The input to BPM 15 and the output of BPM 15 are both fed into a multiplier circuit 26, which generates an output to an analog processing circuit 28. The output of analog processing circuit 28 is applied to multiplier circuit 24, to which is also applied the signal which is to be amplified by BPM 15. The output of multiplier circuit 24 is input into BPM 15. Accordingly, the output of BPM 15 is modified in response to differences in the content of the signal going into BPM 15 and that of the signal coming out of BPM 15.

The techniques illustrated in FIGS. 3 and 4 require very expensive equipment to implement, in that among other things they require high performance analog circuitry that must be properly adjusted by skilled labor and which may subsequently go out of adjustment.

It is well known to reduce intermodulation distortion in power amplifiers by predistorting the signal to be amplified in order to cancel out the distortion that is produced by the amplifier. One type of predistortion employed in the art utilizes predistortion linearization, which will now be discussed briefly.

FIG. 5 illustrates a block diagram of a high power amplifier (HPA) employing a predistortion linearization technique. The signal to be amplified by the HPA is fed into a module 30 which functions according to an inverse model of the signal distortion characteristics of BPM 15. The signal to be amplified by the BPM 15 is also fed into a digital processing circuit 32 along with the output of the BPM 15. The output of the digital processing circuit 32 is coupled to module 30, whose output is coupled to the BPM 15. As a result, the output of BPM 15 is modified in response to differences in the content of the signal going into the BPM 15 and that of the signal coming out of the BPM 15.

Another type of predistortion employed in the art utilizes instantaneous predistortion linearization without memory, which will now be discussed with reference to FIG. 6. FIG. 6 illustrates a block diagram of a high power amplifier (HPA) employing an instantaneous predistortion linearization technique without memory. The signal to be amplified by the HPA is fed into an inverse distortion or predistortion module 40 which performs inverse distortion or predistortion of the signal in an attempt to cancel out the non-linear signal transfer characteristics of BPM 15. The signal to be amplified by the BPM 15 is also fed into a digital processing circuit 42 along with the output of the BPM 15. The digital processing circuit 42 generates model parameters in the form of a description 44 of an amplitude function based on adaptive parameters and a description 46 of a phase function based on adaptive parameters. The outputs of blocks 44 and 46 are coupled to module 40, whose output is coupled to the BPM 15. As a result, the output of BPM 15 is modified in response to differences in the content of the signal going into the BPM 15 and that of the signal coming out of the BPM 15.

The technique of using instantaneous predistortion linearization without memory suffers from an inability to track relatively quick changes in the ambient environment of the HPA, such as heating of the BPM due to relatively quick changes in the average power of the input signal, and to track changes in the bias conditions of the BPM due to relatively quick changes in the average power of the input signal.

The following patents were found in the course of a search for art relating to the inventions described herein:

U.S. Pat. No. 4,291,277 describes the use of an adaptive predistortion technique for linearizing a power amplifier. Digital data to be transmitted is used to access digital codes representing in-phase (I) and quadrature (Q) reference voltages from a memory. The digital codes are processed into a composite signal in the intermediate frequency range and input into the amplifier for transmission. Part of the amplifier output is fed back to a comparator network to be compared with the I and Q reference voltages, and any differences between the I and Q outputs of the amplifier and the respective reference voltages are summed with the I and Q components read out of the memory and are written into the memory as updated predistorted I and Q components.

U.S. Pat. No. 5,148,448 describes an adaptive predistortion circuit for predistorting input data before it goes into the amplifier. The predistortion circuit includes a memory which is continually updated by the results of a comparison of the input data and the amplifier output.

U.S. Pat. No. 5,870,668 describes an amplifier having distortion compensation and a base station for radio communication using such amplifier. The amplifier includes a coefficient-generating circuit for generating compensation coefficients to compensate for distortion characteristics of the amplifier. The coefficient-generating circuit is responsive to an error signal, generated in response to comparing the input signal with an output signal of the amplifier, based upon an adaptive algorithm.

The techniques for adaptive predistortion described in this section, including the above three patents, are generally complex and thus very expensive to implement in wireless base station equipment which is intended to be commercially competitive.

Therefore, there is a substantial need to provide an amplifier which operates in substantially linear fashion near its maximum output and which is relatively inexpensive to implement.

In addition, there is a substantial need for a method for operating an amplifier which operates in substantially linear fashion near its maximum output and which is relatively inexpensive to implement.

There is also a substantial need to provide a wireless base station comprising an amplifier which operates in substantially linear fashion near its maximum output and which is relatively inexpensive to implement.

SUMMARY

Accordingly, in one aspect of the invention there is provided an amplifier having an input and an output, the amplifier comprising a power module coupled to the output, a predistortion module coupled to the input and to the power module, an amplifier gain model coupled to the input and to the predistortion module, and a parameter generator coupled to the input, to the output, and to the amplifier gain module.

In another aspect of the invention, the parameter generator comprises a Kalman filter.

In a further aspect of the invention, the amplifier gain model comprises a polynomial function of the power module gain function and a time constant.

In yet another aspect of the invention, a base station is provided which includes the amplifier having the features and advantages described above.

In an additional aspect of the invention, a method is provided for operating the amplifier having the features and advantages described above.

BRIEF DESCRIPTION OF DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
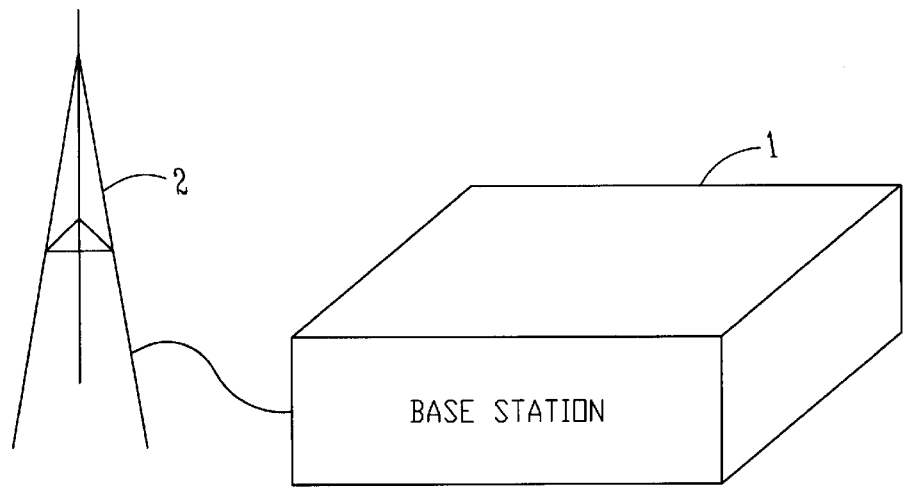
FIG. 1 illustrates a typical wireless base station.
Figure 2:
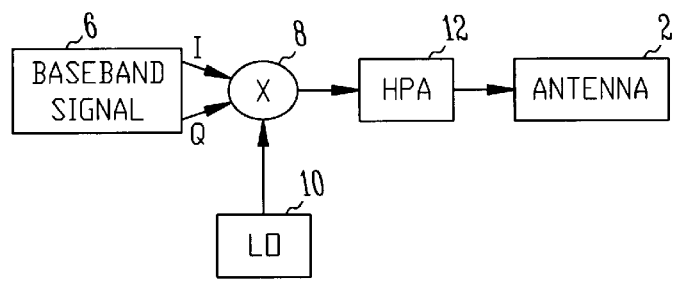
FIG. 2 illustrates a simplified block diagram of a typical base station transmitter operating with QAM.
Figure 3:
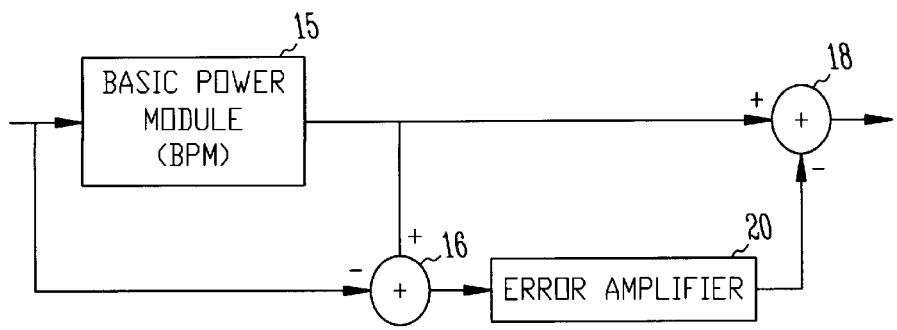
FIG. 3 illustrates a block diagram of a high power amplifier (HPA) employing a feed forward linearization technique.
Figure 4:
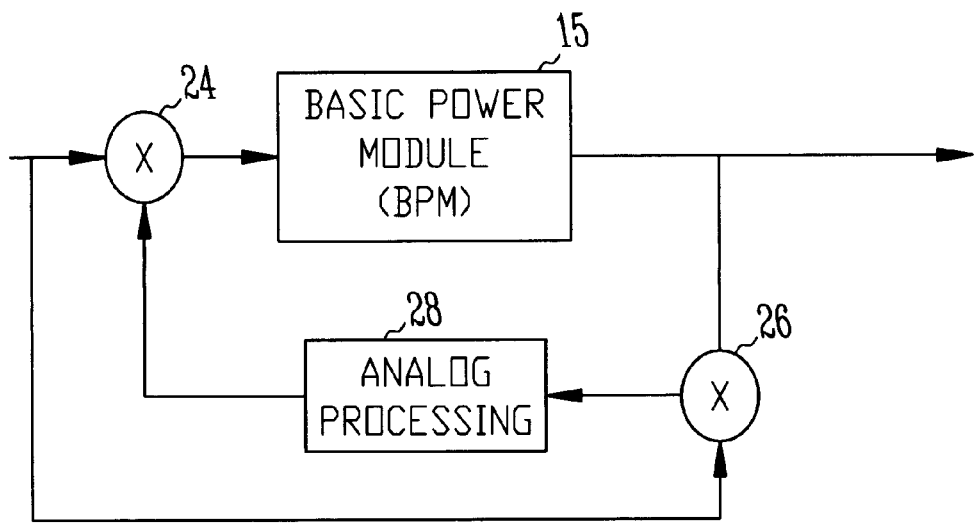
FIG. 4 illustrates a block diagram of a high power amplifier (HPA) employing a feedback linearization technique.
Figure 5:
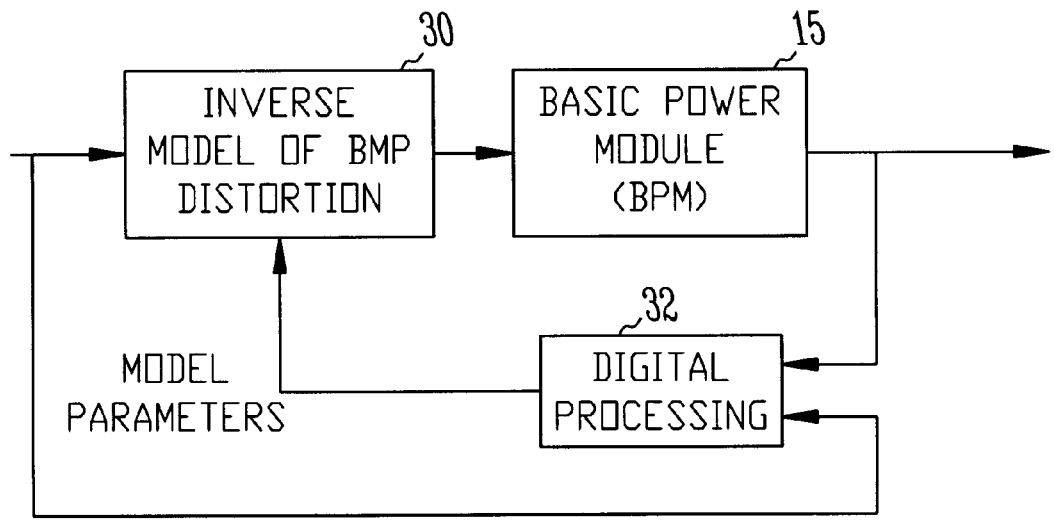
FIG. 5 illustrates a block diagram of a high power amplifier (HPA) employing a predistortion linearization technique.
Figure 6:
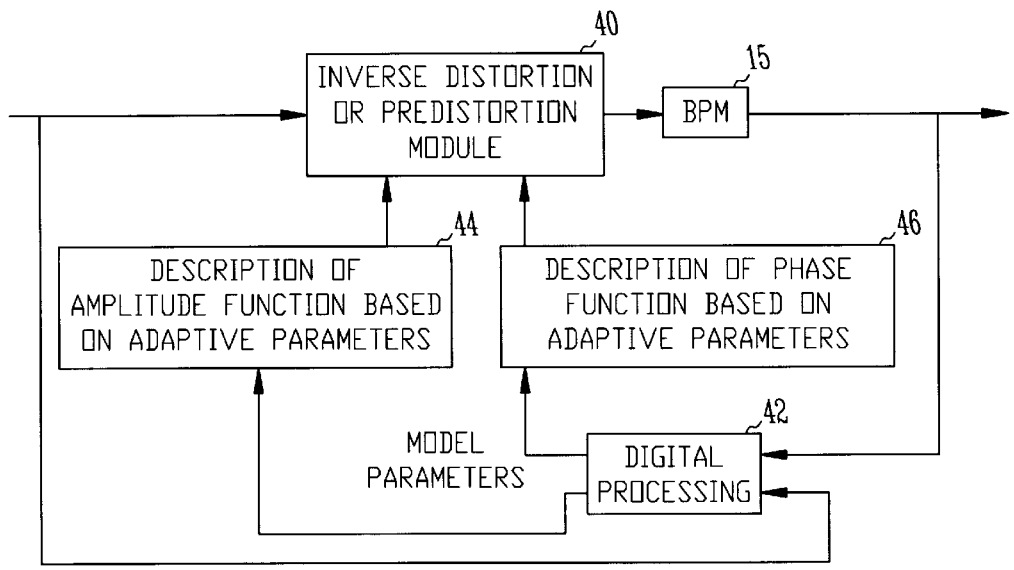
FIG. 6 illustrates a block diagram of a high power amplifier (HPA) employing an instantaneous predistortion linearization technique without memory.
Figure 7:
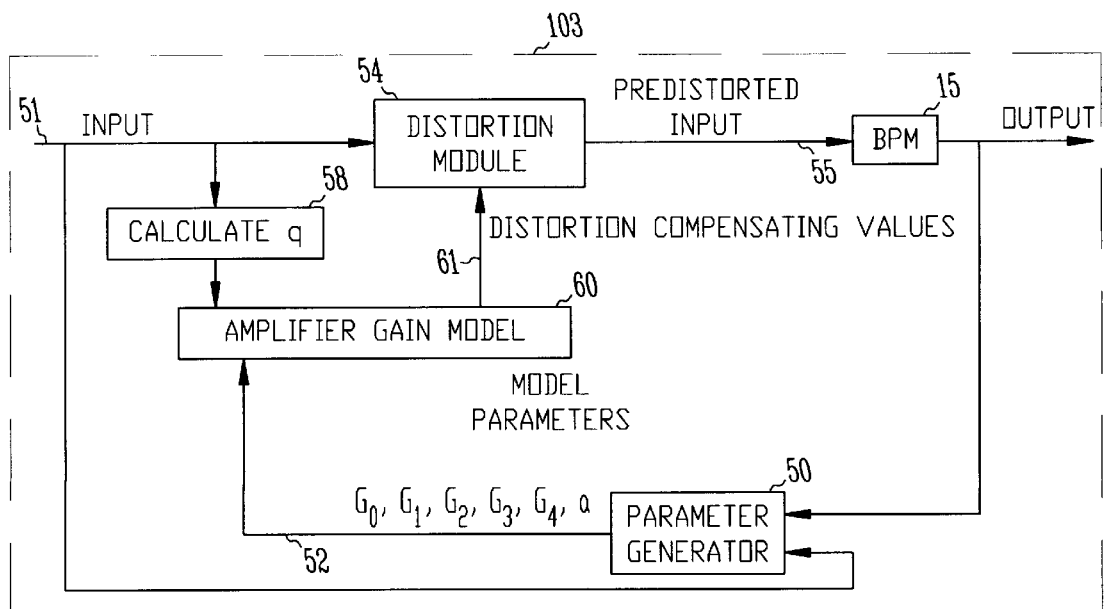
FIG. 7 illustrates a block diagram of a high power amplifier (HPA) employing a predistortion linearization technique with memory, in accordance with a preferred embodiment of the present invention.

FIG. 7 illustrates a block diagram of a high power amplifier (HPA) 103 employing a predistortion linearization technique with memory, in accordance with a preferred embodiment of the present invention.

In FIG. 7 amplifier 103 comprises an input terminal 51 and an output terminal 59. The amplifier further includes a basic power module (BPM) 15 which generates the amplifier's output at output terminal 59. BPM 15 can be any suitable commercially available power amplifier. In a preferred embodiment it is a fixed gain power amplifier. BPM 15 contributes significant distortion to the amplified output signal when BPM 15 is operating at or near its peak output.

Amplifier 103 also includes a parameter generator 50 coupled to input terminal 51 and to output terminal 59. Parameter generator 50 generates model parameters over line 52 in response to differences between the input signal and the output signal. The model parameters are coupled via line 52 to an amplifier gain model 60.

Amplifier gain model 60 is coupled to the amplifier input 51 via a calculation module 58, which calculates the instantaneous input signal power q and generates the result to amplifier gain model 60. Amplifier gain model 60 generates distortion compensating values over line 61 to predistortion module 54.

Predistortion module 54 is coupled to the input terminal 51 and to BPM 15. Predistortion module 54 performs the function of combining the input signal with the distortion compensating values received from amplifier gain model 60 to produce a predistorted input signal over line 55 to BPM 15. BPM 15 amplifies the predistorted input signal, applying its own distortion characteristics, and the resultant output signal from BPM 15 is an amplified signal with substantially all distortion removed.

The amplifier gain model 60 will now be discussed in greater detail. The gain function of BPM 15 is provided by the manufacturer or can be determined by appropriate measurements. In a preferred embodiment the amplifier gain model 60 comprises a polynomial function of the BPM 15 gain function and a time constant.

It will be apparent to those skilled in the art that various models of the gain function of BPM 15 are possible and can be used to implement the present invention.

In a preferred embodiment of the invention, the amplifier gain model is represented by the equation:

$$Y(t) = G(q(t))X(t) \quad \text{[Equation 1]}$$

wherein $G(q(t))$ is the transfer gain matrix of the BPM given by Equation 2 as follows:

$$G(q(t)) = \begin{bmatrix} G_0 + G_1(e^{-at} \otimes q(t)) + G_2(e^{-at} \otimes q^2(t))G_3(e^{-at} \otimes q(t)) + G_4(e^{-at} \otimes q^2(t)) \\ -G_3(e^{-at} \otimes q(t)) + (-G_4)(e^{-at} \otimes q^2(t))G_0 + G_1(e^{-at} \otimes q(t)) + G_2(e^{-at} \otimes q^2(t)) \end{bmatrix}$$

Wherein $\otimes$ is the convolution operator.

Coefficients $G_0$, $G_1$, $G_2$, $G_3$, $G_4$, and time constant "a" are model parameters generated by parameter generator 50.

As mentioned earlier, "q" in Equation 2 is the input power to the power module and is represented by:

$$q = x_r^2 + x_i^2 \quad \text{[Equation 3]}$$

wherein X is the input signal complex vector represented by:

$$X = \begin{bmatrix} x_r \\ x_i \end{bmatrix} \quad \text{[Equation 4]}$$

wherein $X_r$ is the real component of the input signal and $X_i$ is the imaginary component of the input signal, and wherein Y is the output signal complex vector represented by:

$$Y = \begin{bmatrix} y_r \\ y_i \end{bmatrix} \quad \text{[Equation 5]}$$

wherein $Y_r$ is the real component of the output signal and $Y_i$ is the imaginary component of the output signal.

The coefficients $G_0$, $G_1$, $G_2$, $G_3$, $G_4$, and time constant "a" will vary with slow thermal time constants of the thermal and bias effects of BPM 15.

In a preferred embodiment, parameter generator 50 is implemented as a Kalman filter. The Kalman filter used in parameter generator 50 is well known in the art and can be defined as an optimum recursive filter that operates on the basis of least squares approximation. The Kalman filter contains a dynamic model of system errors, characterized as a set of first order linear differential equations. The Kalman filter thus comprises equations in which the state-variables correspond to respective error sources, and the equations express the dynamic relationship between these error sources. Weighting factors can be applied to take account of the relative contributions of the errors.

The Kalman filter constantly reassesses the values of the state-variables (in this case, the parameters $G_0$, $G_1$, $G_2$, $G_3$, $G_4$, and "a") as it receives new measured values, simultaneously taking all past measurements into account. Therefore, the Kalman filter is able to predict a value for the model parameters based on a set of state-variables which are updated recursively from the respective input and output signals. Kalman filters have been shown to be the optimal linear estimator in the least squares sense for estimating dynamic system states in linear systems.

Like the predistortion module 54, calculation module 58, amplifier gain model 60, and the parameter generator 50, including the Kalman filter, can be implemented in any suitable way by one of ordinary skill, either with special purpose hardware or a program-controlled general purpose processor.

Figure 8:
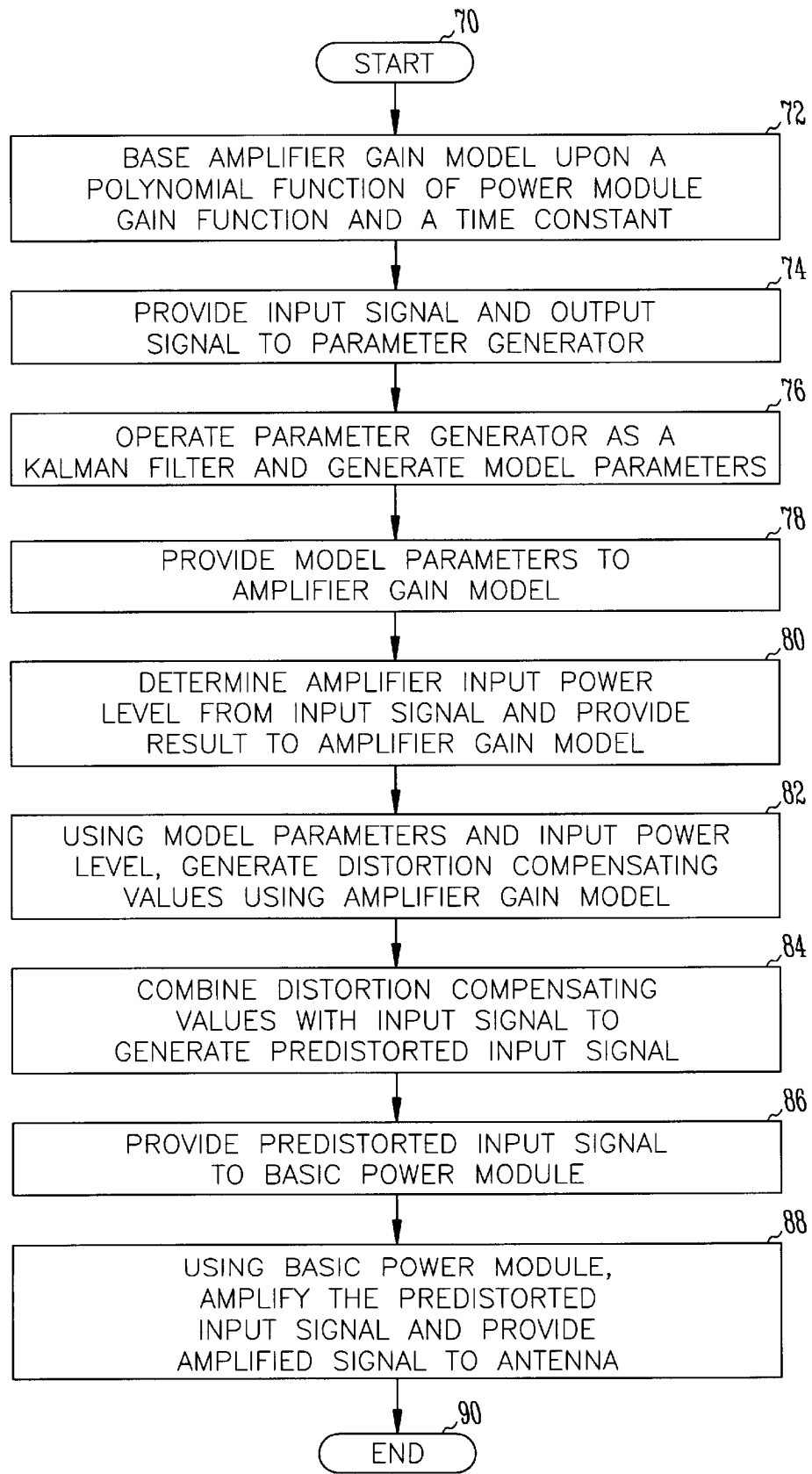
FIG. 8 shows a flow diagram of a method for operating a high power amplifier (HPA) employing a predistortion linearization technique with memory, in accordance with a preferred embodiment of the present invention.

FIG. 8 shows a flow diagram of a method for operating a high power amplifier (HPA) employing a predistortion linearization technique with memory, in accordance with a preferred embodiment of the present invention.

First, the process begins in box 70. In box 72 the amplifier gain model 60 is based upon a polynomial function of the BPM 15 gain function and a time constant "a". In box 74, the input signal and output signal are provided to the parameter generator 50.

In box 76, the parameter generator 50 is operated as a Kalman filter, and model parameters are generated. In box 78, the model parameters are provided to the amplifier gain model 60. In box 80 the input power level of the input signal into amplifier 103 is determined, and the result is provided to the amplifier gain model 60.

In box 82, distortion compensating values are generated by the amplifier gain model 60, using the model parameters and the input power level. In box 84, the distortion compensating values are combined with the input signal to generate a predistorted input signal.

In box 86, the predistorted input signal is provided to the BPM 15. In box 88, the BPM 15 amplifies the predistorted input signal and provides an amplified signal at the amplifier 103 output. When the amplifier 103 is incorporated into a radio communication system base station 101, the amplified signal is provided to antenna 102 for broadcast.

While FIG. 8 illustrates the method as ending in box 90, it will be understood by those skilled in the art that the appropriate steps in FIG. 8 will be iterated repeatedly to carry out the method of operating a power amplifier. It will also be understood that the steps of the method can be carried out in any appropriate order and need not be executed in the order described with reference to FIG. 8.

Figure 9:
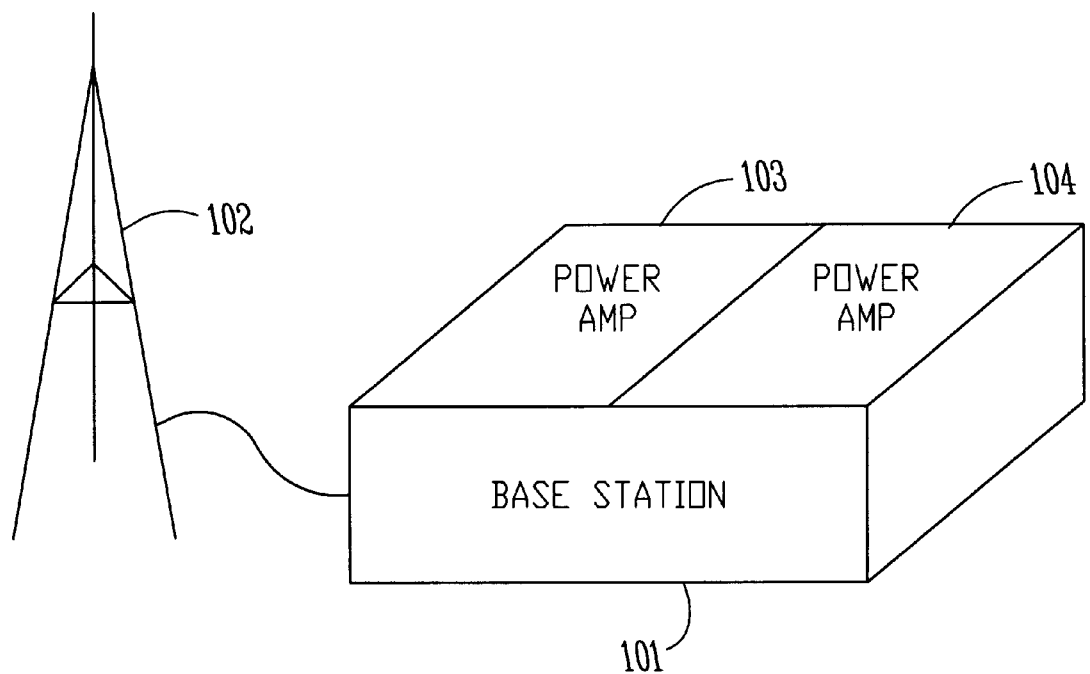
FIG. 9 illustrates a wireless base station comprising a high power amplifier (HPA) employing a predistortion linearization technique with memory, in accordance with a preferred embodiment of the present invention.

FIG. 9 illustrates a wireless base station 101 comprising a power amplifier employing a predistortion linearization technique with memory, in accordance with a preferred embodiment of the present invention.

As shown in FIG. 9 wireless base station 101 comprises at least one power amplifier 103 of the type illustrated in FIG. 7. Wireless base station 101 can comprise, if needed, a plurality of additional power amplifiers, such as power amplifier 104. In addition, wireless base station 101 comprises a suitable antenna 102. In a preferred embodiment, wireless base station comprises equipment suitable for sending and receiving Code Division Multiple Access (CDMA) communications. However, it will be apparent to one of ordinary skill that wireless base station 101 can be used for providing wireless communications in any desired manner and for any type of wireless communications protocol or standard.

In summary, the present invention provides an amplifier which operates in substantially linear fashion near its maximum output and which is relatively inexpensive to implement.

In another aspect of the present invention, there is provided a wireless base station comprising an amplifier which operates in substantially linear fashion near its maximum output and which is relatively inexpensive to implement.

It is an important advantage of the present invention that relatively inexpensive basic power modules (BPM's) can be used. The present invention does not require expensive analog circuitry or labor-intensive manufacturing and testing procedures to implement. Thus, a commercially competitive amplifier and system-level or sub-system level equipment incorporating such amplifier, such as a wireless base station, can be manufactured and marketed.

It will be apparent to those skilled in the art that the disclosed invention can be modified in numerous ways and can assume many embodiments other than the preferred form specifically set out and described above.

For example, it will be understood by one of ordinary skill in the art that in the polynomial or other type of equation which is used to model the gain of the BPM, fewer or more coefficients may be used than those described herein. Also, other suitable models may be utilized than the one herein described.

The present invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An amplifier having an input and an output, said amplifier comprising:
   a power module coupled to said output and having a gain function;
   a predistortion module coupled to said input and to said power module;
   an amplifier gain model coupled to said input and to said predistortion module and comprising a polynomial function of the power module gain function and a time constant; and
   a parameter generator coupled to said input, to said output, and to said amplifier gain module.

2. The amplifier claimed in claim 1, wherein said parameter generator comprises a Kalman filter.

3. The amplifier claimed in claim 1, wherein said amplifier gain model is represented by the equation $$Y(t) = G(q(t))X(t)$$

wherein $G(q(t))$ is the transfer gain matrix of said power module given by $$G(q(t)) = \begin{bmatrix} G_0 + G_1(e^{-at} \otimes q(t)) + G_2(e^{-at} \otimes q^2(t))G_3(e^{-at} \otimes q(t)) + G_4(e^{-at} \otimes q^2(t)) \\ -G_3(e^{-at} \otimes q(t)) + (-G_4)(e^{-at} \otimes q^2(t))G_0 + G_1(e^{-at} \otimes q(t)) + G_2(e^{-at} \otimes q^2(t)) \end{bmatrix}$$

wherein $\otimes$ is the convolution operator, wherein coefficients $G_0, G_1, G_2, G_3, G_4$, and time constant "a" are parameters generated by said parameter generator, wherein q is the input power to the power module and is represented by the equation $$q = x_r^2 + x_i^2$$

wherein X is the input signal complex vector represented by $$X = \begin{bmatrix} x_r \\ x_i \end{bmatrix}$$

wherein $X_r$ is the real component of the input signal and $X_i$ is the imaginary component of the input signal, wherein Y is the output signal complex vector represented by $$Y = \begin{bmatrix} y_r \\ y_i \end{bmatrix}$$

and wherein $y_r$ is the real component of the output signal and $y_i$ is the imaginary component of the output signal.

4. An amplifier having an input for receiving an input signal and an output from which an output signal is produced, said amplifier comprising:
   a power module responsive to said input signal and having a gain function, said power module amplifying a signal applied thereto to produce said output signal but contributing distortion to said output signal when said power module is operating at or near its peak output;
   a parameter generator coupled to said input signal and to said output signal, said parameter generator generating model parameters in response to differences between said input signal and said output signal;
   an amplifier gain model responsive to said model parameters and comprising a polynomial function of the power module gain function and a time constant, said amplifier gain model generating distortion compensating values; and
   a predistortion module responsive to said input signal and to said distortion compensating values, said predistortion module generating a predistorted input signal to said power module, whereby said input signal is amplified and said distortion is canceled.

5. The amplifier claimed in claim 4, wherein said parameter generator comprises a Kalman filter.

6. The amplifier claimed in claim 4, wherein said amplifier gain model is represented by the equation $$Y(t) = G(q(t))X(t)$$

wherein $G(q(t))$ is the transfer gain matrix of said power module given by $$G(q(t)) = \begin{bmatrix} G_0 + G_1(e^{-at} \otimes q(t)) + G_2(e^{-at} \otimes q^2(t))G_3(e^{-at} \otimes q(t)) + G_4(e^{-at} \otimes q^2(t)) \\ -G_3(e^{-at} \otimes q(t)) + (-G_4)(e^{-at} \otimes q^2(t))G_0 + G_1(e^{-at} \otimes q(t)) + G_2(e^{-at} \otimes q^2(t)) \end{bmatrix}$$

wherein $\otimes$ is the convolution operator, wherein coefficients $G_0$, $G_1$, $G_2$, $G_3$, $G_4$, and time constant "a" are parameters generated by said parameter generator, wherein q is the input power to the power module and is represented by the equation $$q = x_r^2 + x_i^2$$

wherein X is the input signal complex vector represented by $$X = \begin{bmatrix} x_r \\ x_i \end{bmatrix}$$

wherein $X_r$ is the real component of the input signal and $X_i$ is the imaginary component of the input signal, wherein Y is the output signal complex vector represented by $$Y = \begin{bmatrix} y_r \\ y_i \end{bmatrix}$$

and wherein $y_r$ is the real component of the output signal and $y_i$ is the imaginary component of the output signal.

7. An amplifier having an input for receiving an input signal and an output from which an output signal is produced, said amplifier comprising:

amplifying means responsive to said input signal and having a gain function, said amplifying means amplifying a signal applied thereto to produce said output signal but contributing distortion to said output signal when said amplifying means is operating at or near its peak output;

parameter generating means coupled to said input signal and to said output signal for generating model parameters in response to differences between said input signal and said output signal;

amplifier gain modeling means responsive to said model parameters for generating distortion compensating values and comprising a polynomial function of the amplifying means gain function and a time constant; and predistortion means responsive to said input signal and to said distortion compensating values, said predistortion means generating a predistorted input signal to said amplifying means, whereby said input signal is amplified and said distortion is canceled.

8. The amplifier claimed in claim 7, wherein said parameter generating means comprises a Kalman filter.

9. The amplifier claimed in claim 7, wherein said amplifier gain modeling means is represented by the equation $$Y(t) = G(q(t))X(t)$$

wherein $G(q(t))$ is the transfer gain matrix of said amplifying means given by $$G(q(t)) = \begin{bmatrix} G_0 + G_1(e^{-at} \otimes q(t)) + G_2(e^{-at} \otimes q^2(t))G_3(e^{-at} \otimes q(t)) + G_4(e^{-at} \otimes q^2(t)) \\ -G_3(e^{-at} \otimes q(t)) + (-G_4)(e^{-at} \otimes q^2(t))G_0 + G_1(e^{-at} \otimes q(t)) + G_2(e^{-at} \otimes q^2(t)) \end{bmatrix}$$

wherein $\otimes$ is the convolution operator, wherein coefficients $G_0$, $G_1$, $G_2$, $G_3$, $G_4$, and time constant "a" are parameters generated by said parameter generating means, wherein q is the input power to the amplifying means and is represented by the equation $$q = x_r^2 + x_i^2$$

wherein X is the input signal complex vector represented by $$X = \begin{bmatrix} x_r \\ x_i \end{bmatrix}$$

wherein $X_r$ is the real component of the input signal and $X_i$ is the imaginary component of the input signal, wherein Y is the output signal complex vector represented by $$Y = \begin{bmatrix} y_r \\ y_i \end{bmatrix}$$

and wherein $y_r$ is the real component of the output signal and $y_i$ is the imaginary component of the output signal.

10. A wireless base station comprising:

a power amplifier having an input and an output, said power amplifier comprising a power module coupled to said output and having a gain function;

a predistortion module coupled to said input and to said power module;

an amplifier gain model coupled to said input and to said predistortion module and comprising a polynomial function of the power module gain function and a time constant; and a parameter generator coupled to said input, to said output, and to said amplifier gain module; and an antenna coupled to the output of the power amplifier.

11. The base station claimed in claim 10, wherein said parameter generator comprises a Kalman filter.

12. The base station claimed in claim 10, wherein said amplifier gain model is represented by the equation $$Y(t)=G(q(t))X(t)$$

wherein $G(q(t))$ is the transfer gain matrix of said power module given by $$G(q(t)) = \begin{bmatrix} G_0 + G_1(e^{-at} \otimes q(t)) + G_2(e^{-at} \otimes q^2(t))G_3(e^{-at} \otimes q(t)) + G_4(e^{-at} \otimes q^2(t)) \\ -G_3(e^{-at} \otimes q(t)) + (-G_4)(e^{-at} \otimes q^2(t))G_0 + G_1(e^{-at} \otimes q(t)) + G_2(e^{-at} \otimes q^2(t)) \end{bmatrix}$$

wherein $\otimes$ is the convolution operator, wherein coefficients $G_0, G_1, G_2, G_3, G_4$, and time constant "a" are parameters generated by said parameter generator, wherein q is the input power to the power module and is represented by the equation $$q=x_r^2+x_i^2$$

wherein X is the input signal complex vector represented by $$X = \begin{bmatrix} x_r \\ x_i \end{bmatrix}$$

wherein $X_r$ the real component of the input signal and $X_i$ is the imaginary component of the input signal, wherein Y is the output signal complex vector represented by $$Y = \begin{bmatrix} y_r \\ y_i \end{bmatrix}$$

and wherein $y_r$ is the real component of the output signal and $y_i$ is the imaginary component of the output signal.

13. A method for operating a power amplifier having an input and an output, said power amplifier comprising a power module coupled to said output and having a gain function, a predistortion module coupled to said input and to said power module, an amplifier gain model coupled to said input and to said predistortion module and comprising a polynomial function of the power module gain function and a time constant, and a parameter generator coupled to said input, to said output, and to said amplifier gain module, wherein said method comprises operating said parameter generator as a Kalman filter.

14. The method claimed in claim 13, wherein said amplifier gain model is represented by the equation $$Y(t)=G(q(t))X(t)$$

wherein $G(q(t))$ is the transfer gain matrix of said power module given by $$G(q(t)) = \begin{bmatrix} G_0 + G_1(e^{-at} \otimes q(t)) + G_2(e^{-at} \otimes q^2(t))G_3(e^{-at} \otimes q(t)) + G_4(e^{-at} \otimes q^2(t)) \\ -G_3(e^{-at} \otimes q(t)) + (-G_4)(e^{-at} \otimes q^2(t))G_0 + G_1(e^{-at} \otimes q(t)) + G_2(e^{-at} \otimes q^2(t)) \end{bmatrix}$$

wherein $\otimes$ is the convolution operator, wherein coefficients $G_0, G_1, G_2, G_3, G_4$, and time constant "a" are parameters generated by said parameter generator, wherein q is the input power to the power module and is represented by the equation $$q=x_r^2+x_i^2$$

wherein X is the input signal complex vector represented by $$X = \begin{bmatrix} x_r \\ x_i \end{bmatrix}$$

wherein $X_r$ is the real component of the input signal and $X_i$ is the imaginary component of the input signal, wherein Y is the output signal complex vector represented by $$Y = \begin{bmatrix} y_r \\ y_i \end{bmatrix}$$

and wherein $y_r$ is the real component of the output signal and $y_i$ is the imaginary component of the output signal.

15. A method for operating a power amplifier having an input receiving an input signal and an output from which an output signal is produced, said power amplifier comprising a power module coupled to said output, a predistortion module coupled to said input and to said power module, an amplifier gain model coupled to said input and to said predistortion module, and a parameter generator coupled to said input, to said output, and to said amplifier gain module, wherein said method comprises basing said amplifier gain model upon a polynomial function of the power module gain function and a time constant.

16. The method claimed in claim 15, wherein said parameter generator comprises a Kalman filter.

17. The method claimed in claim 15, wherein said amplifier gain model is represented by the equation $$Y(t)=G(q(t))X(t)$$

wherein $G(q(t))$ is the transfer gain matrix of said power module given by $$G(q(t)) = \begin{bmatrix} G_0 + G_1(e^{-at} \otimes q(t)) + G_2(e^{-at} \otimes q^2(t))G_3(e^{-at} \otimes q(t)) + G_4(e^{-at} \otimes q^2(t)) \\ -G_3(e^{-at} \otimes q(t)) + (-G_4)(e^{-at} \otimes q^2(t))G_0 + G_1(e^{-at} \otimes q(t)) + G_2(e^{-at} \otimes q^2(t)) \end{bmatrix}$$

wherein $\otimes$ is the convolution operator, wherein coefficients $G_0, G_1, G_2, G_3, G_4$, and time constant "a" are parameters generated by said parameter generator, wherein q is the input power to the power module and is represented by the equation $$q = x_r^2 + x_i^2$$

wherein X is the input signal complex vector represented by $$X = \begin{bmatrix} x_r \\ x_i \end{bmatrix}$$

wherein $X_r$ is the real component of the input signal and $X_i$ is the imaginary component of the input signal, wherein Y is the output signal complex vector represented by $$Y = \begin{bmatrix} y_r \\ y_i \end{bmatrix}$$

and wherein $y_r$ is the real component of the output signal and $y_i$ is the imaginary component of the output signal.

* * * * *